United States Patent
Jo et al.

(10) Patent No.: US 12,181,528 B2
(45) Date of Patent: Dec. 31, 2024

(54) BUSBAR DIAGNOSIS DEVICE, BATTERY PACK, ENERGY STORAGE SYSTEM, AND BUSBAR DIAGNOSIS METHOD

(71) Applicant: LG ENERGY SOLUTION, LTD., Seoul (KR)

(72) Inventors: Yong-Min Jo, Daejeon (KR); Nak-Choon Lee, Daejeon (KR); Mu-Yeon Lee, Daejeon (KR); Ju-Yeon Jeong, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 132 days.

(21) Appl. No.: 18/008,613

(22) PCT Filed: Jan. 21, 2022

(86) PCT No.: PCT/KR2022/001154
§ 371 (c)(1),
(2) Date: Dec. 6, 2022

(87) PCT Pub. No.: WO2022/158909
PCT Pub. Date: Jul. 28, 2022

(65) Prior Publication Data
US 2023/0251315 A1    Aug. 10, 2023

(30) Foreign Application Priority Data
Jan. 21, 2021   (KR) .................. 10-2021-0008928

(51) Int. Cl.
*G01R 31/364* (2019.01)
*G01R 31/3842* (2019.01)
(Continued)

(52) U.S. Cl.
CPC ....... *G01R 31/364* (2019.01); *G01R 31/3842* (2019.01); *G01R 31/396* (2019.01); *H01M 10/482* (2013.01); *H02J 7/0047* (2013.01)

(58) Field of Classification Search
None
See application file for complete search history.

(56) References Cited

U.S. PATENT DOCUMENTS

2010/0271036 A1 * 10/2010 Kishimoto ............ H01M 50/51
324/434
2012/0057316 A1 * 3/2012 Kaneshige .......... H01M 50/213
361/752
(Continued)

FOREIGN PATENT DOCUMENTS

JP     2005-134154 A    5/2005
JP     2011-54440 A     3/2011
(Continued)

OTHER PUBLICATIONS

Extended European Search Report for European Application No. 22742885.1, dated Nov. 9, 2023.
(Continued)

*Primary Examiner* — Jas A Sanghera
(74) *Attorney, Agent, or Firm* — Birch, Stewart, Kolasch & Birch, LLP

(57) ABSTRACT

A busbar diagnosis apparatus includes a plurality of voltage sensing pins, a battery monitoring circuit, a voltage sensing channel, a bypass unit and a control circuit to diagnose s busbar. A voltage of each of a plurality of battery cells of a first battery module and a plurality of battery cells of a second battery module is detected using a potential difference of every two adjacent voltage sensing pins, and the busbar is diagnosed based on a voltage history of each of the plurality of battery cells.

13 Claims, 5 Drawing Sheets

(51) Int. Cl.
*G01R 31/396* (2019.01)
*H01M 10/48* (2006.01)
*H02J 7/00* (2006.01)

(56) References Cited

U.S. PATENT DOCUMENTS

| | | | |
|---|---|---|---|
| 2012/0280692 A1* | 11/2012 | Park | G01R 31/68 |
| | | | 324/426 |
| 2014/0232413 A1* | 8/2014 | Kitahara | G01R 31/396 |
| | | | 324/434 |
| 2015/0044531 A1 | 2/2015 | Itagaki et al. | |
| 2016/0306014 A1 | 10/2016 | Jeon | |
| 2017/0117596 A1 | 4/2017 | Kubo | |
| 2018/0106865 A1* | 4/2018 | Hashimoto | H02J 7/0016 |
| 2018/0226690 A1* | 8/2018 | Hwang | H02J 7/0029 |
| 2019/0222036 A1 | 7/2019 | Yano et al. | |
| 2020/0287251 A1 | 9/2020 | Yonekura et al. | |
| 2020/0355747 A1 | 11/2020 | An | |

FOREIGN PATENT DOCUMENTS

| | | |
|---|---|---|
| JP | 2014-183671 A | 9/2014 |
| JP | 2015-83960 A | 4/2015 |
| JP | 2017-78658 A | 4/2017 |
| KR | 10-2013-0137389 A | 12/2013 |
| KR | 10-2014-0055065 A | 5/2014 |
| KR | 10-2016-0068522 A | 6/2016 |
| KR | 10-1665003 B1 | 10/2016 |
| KR | 10-2019-0065708 A | 6/2019 |
| KR | 10-2019-0086967 A | 7/2019 |
| KR | 10-1967862 B1 | 8/2019 |
| KR | 10-2020-0029305 A | 3/2020 |
| WO | WO 2016/143280 A1 | 9/2016 |
| WO | WO 2019/069390 A1 | 4/2019 |

OTHER PUBLICATIONS

International Search Report for PCT/KR2022/001154 (PCT/ISA/210) mailed on May 19, 2022.

\* cited by examiner

BUSBAR DIAGNOSIS DEVICE, BATTERY PACK, ENERGY STORAGE SYSTEM, AND BUSBAR DIAGNOSIS METHOD

TECHNICAL FIELD

The present application claims the benefit of Korean Patent Application No. 10-2021-0008928 filed on Jan. 21, 2021 with the Korean Intellectual Property Office, the disclosure of which is incorporated herein by reference in its entirety.

The present disclosure relates to fault diagnosis of a busbar used to connect two battery modules in series.

BACKGROUND ART

Recently, there has been a rapid increase in the demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

Recently, to provide high voltage, there is a growing demand for a battery pack including two or more battery modules connected in series through a busbar, each battery module including a plurality of battery cells connected in series.

However, a fault may occur in the busbar due to external impacts or aging of the busbar itself. When the busbar is faulty, the safety of the battery pack becomes low, so there is a need for an approach to accurate fault diagnosis of the busbar.

Patent Literature 1 discloses fault detection of a busbar based on a voltage across a busbar itself or a voltage across an assembly of battery cells and busbars connected in series. However, the voltage measurement of the busbar independent of voltage measurement of the battery cell is inefficient.

(Patent Literature 1) Korean Patent Publication No. 10-2012-0080315 (published on Jul. 17, 2012)

DISCLOSURE

Technical Problem

The present disclosure is designed to solve the above-described problem, and therefore the present disclosure is directed to providing a busbar diagnosis apparatus, a battery pack, an energy storage system and a busbar diagnosis method for fault diagnosis of a busbar based on voltage history of two battery cells, each connected to each of two ends of the busbar without a procedure of measuring the voltage of the busbar.

These and other objects and advantages of the present disclosure may be understood by the following description and will be apparent from an embodiment of the present disclosure. In addition, it will be readily understood that the objects and advantages of the present disclosure may be realized by the means set forth in the appended claims and a combination thereof.

Technical Solution

A busbar diagnosis apparatus according to an aspect of the present disclosure is provided for a battery pack including a busbar connected between a positive terminal of a first battery module including a plurality of battery cells connected in series and a negative terminal of a second battery module including a plurality of battery cells connected in series. The busbar diagnosis apparatus includes a battery monitoring circuit including a plurality of voltage sensing pins, and configured to detect a voltage of each of the plurality of battery cells of the first battery module and the plurality of battery cells of the second battery module using a potential difference of every two adjacent voltage sensing pins; a voltage sensing channel including a plurality of voltage sensing lines connecting a positive electrode and a negative electrode of each of the plurality of battery cells of the first battery module and the plurality of battery cells of the second battery module to the plurality of voltage sensing pins; a bypass unit connected to the busbar through a first voltage sensing pin and a second voltage sensing pin among the plurality of voltage sensing pins, wherein the first voltage sensing pin is connected to the positive electrode of the battery cell disposed on the most upstream of the first battery module through one of the plurality of voltage sensing lines and the second voltage sensing pin is connected to the negative electrode of the battery cell disposed on the most downstream of the second battery module through the other voltage sensing line among the plurality of voltage sensing lines; and a control circuit configured to diagnose the busbar based on a voltage history of each of the plurality of battery cells of the first battery module and the plurality of battery cells of the second battery module, detected by the battery monitoring circuit.

The bypass unit may include a diode. An anode and a cathode of the diode may be connected to the first voltage sensing pin and the second voltage sensing pin, respectively.

Each voltage sensing line may include a protection resistor having a predetermined resistance value.

The battery monitoring circuit may further include a pair of current sensing pins connected to a current path of the battery pack. The battery monitoring circuit may be configured to detect an electric current flowing through the current path using a potential difference between the pair of current sensing pins.

When it is determined that the battery pack is kept in a discharge mode for a set time or more, the control circuit may be configured to determine an average voltage of the plurality of battery cells of the first battery module and the plurality of battery cells of the second battery module at each predetermined diagnosis time, increase a diagnosis count by a predetermined value when both a difference between the voltage of the battery cell disposed on the most upstream of the first battery module and the average voltage and a difference between the voltage of the battery cell disposed on the most downstream of the second battery module and the average voltage are larger than a reference voltage difference, and set a diagnosis flag indicating that the busbar is in a fault condition when the increased diagnosis count is equal to or larger than a reference count.

The control circuit may be configured to set the diagnosis count to be equal to an initial value less than the reference count when at least one of the difference between the voltage of the battery cell disposed on the most upstream of the first battery module and the average voltage or the difference between the voltage of the battery cell disposed on the most downstream of the second battery module and the average voltage is equal to or smaller than the reference voltage difference.

When it is determined that the battery pack is switched from a rest mode or a charge mode to a discharge mode, the control circuit may be configured to determine a voltage drop of the battery cell disposed on the most upstream of the first battery module, a voltage drop of the battery cell disposed on the most downstream of the second battery module and an average voltage drop of the plurality of battery cells of the first battery module and the plurality of battery cells of the second battery module, over the diagnosis time, and set a diagnosis flag indicating that the busbar is in a fault condition when both a difference between the voltage drop of the battery cell disposed on the most upstream of the first battery module and the average voltage drop and a difference between the voltage drop of the battery cell disposed on the most downstream of the second battery module and the average voltage drop are larger than a reference voltage drop.

The control circuit may be configured to determine the reference voltage drop by multiplying a change in electric current over the diagnosis time by a predetermined conversion coefficient when it is determined that the battery pack is switched from the rest mode or the a charge mode to the discharge mode.

A battery pack according to another aspect of the present disclosure includes the busbar diagnosis apparatus.

An energy storage system according to still another aspect of the present disclosure includes the battery pack.

A busbar diagnosis method according to yet another aspect of the present disclosure is provided to be executable by the busbar diagnosis apparatus. The busbar diagnosis method includes detecting, by the battery monitoring circuit, a voltage of each of the plurality of battery cells of the first battery module and the plurality of battery cells of the second battery module using a potential difference between every two adjacent voltage sensing pins among the plurality of voltage sensing pins; diagnosing, by the control circuit, the busbar based on a voltage history of each of the plurality of battery cells of the first battery module and the plurality of battery cells of the second battery module, detected by the battery monitoring circuit; and stopping a power conversion system connected to the first battery module or turning off a relay between the power conversion system and the first battery module when a bus bar fault condition is detected between by the control circuit.

Advantageous Effects

According to at least one of the embodiments of the present disclosure, it is possible to achieve fault diagnosis of a busbar based on the voltage history of two battery cells, each connected to each of two ends of the busbar without a procedure of measuring the voltage of the busbar.

According to at least one of the embodiments of the present disclosure, it is possible to achieve a more accurate fault diagnosis of a busbar by adjusting the reference (for example, the reference voltage drop as described below) used to determine if the busbar is faulty based on the electric current of the battery pack that changes over time.

The effects of the present disclosure are not limited to the above-mentioned effects, and these and other effects will be clearly understood by those skilled in the art from the appended claims.

DESCRIPTION OF DRAWINGS

The accompanying drawings illustrate a preferred embodiment of the present disclosure, and together with the detailed description of the present disclosure as described below, serve to provide a further understanding of the technical aspects of the present disclosure, and thus the present disclosure should not be construed as being limited to the drawings.

BEST MODE

Figure 1:
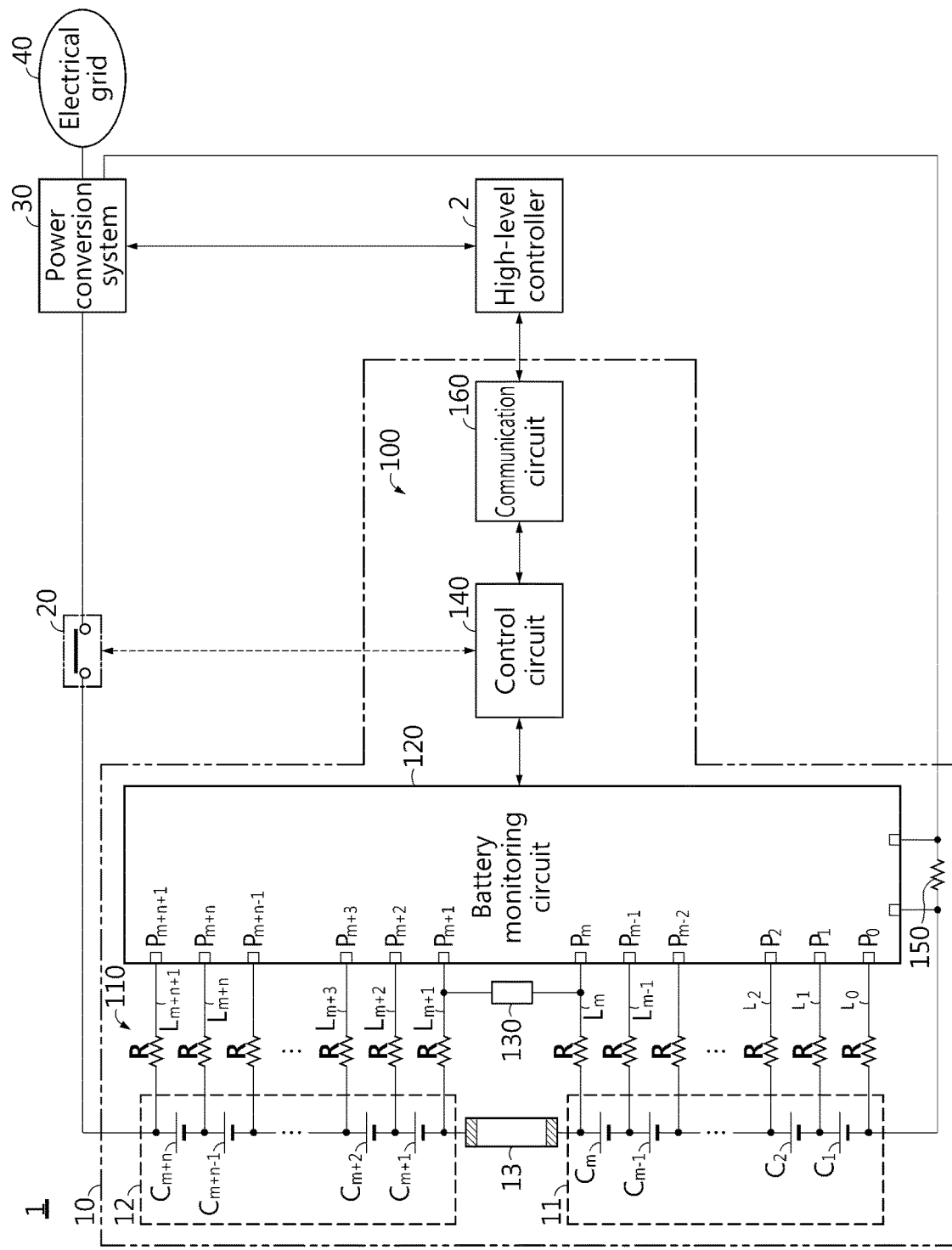
FIG. 1 is an exemplary diagram showing the architecture of an energy storage system according to the present disclosure.

Hereinafter, a preferred embodiment of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and the illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements.

Unless the context clearly indicates otherwise, it will be understood that the term "comprises" when used in this specification, specifies the presence of stated elements, but does not preclude the presence or addition of one or more other elements. Additionally, the term "control circuit" as used herein refers to a processing unit of at least one function or operation, and may be implemented by hardware and software either alone or in combination.

In addition, throughout the specification, it will be further understood that when an element is referred to as being "connected to" another element, it can be directly connected to the other element or intervening elements may be present.

FIG. 1 is an exemplary diagram showing the architecture of an energy storage system according to the present disclosure.

Referring to FIG. 1, the energy storage system 1 includes a battery pack 10, a relay 20 and a power conversion system 30.

The battery pack 10 includes a first battery module 11, a second battery module 12, a busbar 13 and a busbar diagnosis apparatus 100.

A series circuit of the first battery module 11, the busbar 13 and the second battery module 12 is electrically connectable to the power conversion system 30 through the relay 20.

The first battery module 11 includes a plurality of battery cells $C_1 \sim C_m$ connected in series, where m is a natural number of 2 or greater. The second battery module 12 includes a plurality of battery cells $C_{m+1} \sim C_{m+n}$ connected in series, where n is a natural number of 2 or greater.

The plurality of battery cells $C_1 \sim C_m$ and the plurality of battery cells $C_{m+1} \sim C_{m+n}$ may be manufactured with the same electrochemical specification. Hereinafter, in describing the subject matter that is common to all the battery cells $C_1 \sim C_{m+n}$ included in the battery pack 10, the reference symbol 'C' is used to refer to the battery cell.

The battery cell C is not limited to a particular type and may include any type of battery cell that can be repeatedly recharged, for example, a lithium ion cell.

In the first battery module 11, each of the plurality of battery cells $C_1 \sim C_m$ has a positive electrode lead and a negative electrode lead, and the positive electrode lead of one (for example, $C_1$) of two adjacent battery cells (for example, $C_1$, $C_2$) and the negative electrode lead of the other (for example, $C_2$) may be joined together through welding. Accordingly, a series connection structure from the negative electrode lead of the battery cell $C_1$ to the positive electrode lead of the battery cell $C_m$ is positioned in the first battery module 11.

In the second battery module 12, each of the plurality of battery cells $C_{m+1} \sim C_{m+n}$ has a positive electrode lead and a negative electrode lead, and the positive electrode lead of one (for example, $C_{m+1}$) of two adjacent battery cells (for example, $C_{m+1}$, $C_{m+2}$) and the negative electrode lead of the other (for example, $C_{m+2}$) are joined together through welding. Accordingly, a series connection structure from the negative electrode lead of the battery cell $C_{m+1}$ to the positive electrode lead of the battery cell $C_{m+n}$ is positioned in the second battery module 12.

Hereinafter, it should be noted that the positive electrode lead and the negative electrode lead of the battery cell C may be also referred to as a 'positive electrode' and a 'negative electrode', respectively.

A plus terminal of the first battery module 11 is connected to a minus terminal of the second battery module 12 through the busbar 13. For example, one end of the busbar 13 is fixed and coupled to the plus terminal of the first battery module 11 through a bolt, and the other end of the busbar 13 is fixed and coupled to the minus terminal of the second battery module 12 through a bolt.

In each battery module 11, 12, an electrical location of lower potential may be referred to as 'downstream' and the opposite location may be referred to as 'upstream'. For example, the battery cell $C_m$ is disposed on the most upstream of the first battery module 11, and the battery cell $C_{m+1}$ is disposed on the most downstream of the second battery module 12. The plus terminal of the first battery module 11 may have the same potential as the positive electrode of the battery cell $C_m$, and the minus terminal of the second battery module 12 may have the same potential as the negative electrode of the battery cell $C_{m+1}$. When x is a natural number of 2 or greater and m+n or smaller, it may be said that the battery cell $C_x$ is disposed on the upstream of the battery cell $C_{x-1}$, and the battery cell $C_{x-1}$ is disposed on the downstream of the battery cell $C_x$.

The relay 20 is installed on a power line provided as a current path for the charge/discharge of the battery pack 10. While the relay 20 is on, power may be transferred from any one of the battery pack 10 and the power conversion system 30 to the other. The relay 20 may include at least one of well-known switching devices, for example, a mechanical contactor and a Field Effect Transistor (FET). A control circuit 140 may perform on/off control of the relay 20 according to the diagnosis result of the busbar 13 as described below.

The power conversion system 30 is operably coupled to the busbar diagnosis apparatus 100 through a high-level controller 2. The power conversion system 30 may produce DC power for the charge of the battery pack 10 from AC power supplied by an electrical grid 40. The power conversion system 30 may produce AC power from DC power from the battery pack 10.

The busbar diagnosis apparatus 100 is provided to monitor a fault of the busbar 13. The fault of the busbar 13 refers to an increase in the total resistance across the busbar 13 above an allowed value from a predetermined initial value due to at least one of (i) a defect (for example, crack) of the busbar 13 itself, (ii) failed coupling to the plus terminal of the first battery module 11 and (iii) failed coupling to the minus terminal of the second battery module 12.

The busbar diagnosis apparatus 100 includes a voltage sensing channel 110, a battery monitoring circuit 120, a bypass device 130 and the control circuit 140. The busbar diagnosis apparatus 100 may further include at least one of a shunt resistor 150 or a communication circuit 160.

The battery monitoring circuit 120 includes a plurality of voltage sensing pins $P_0 \sim P_{m+n+1}$. The plurality of voltage sensing pins $P_0 \sim P_{m+n+1}$ is provided electrically connectably to the positive electrode lead and the negative electrode lead of each of the plurality of battery cells $C_1 \sim C_{m+n}$ through the voltage sensing channel 110. The battery monitoring circuit 120 may be implemented in hardware using application specific integrated circuits (ASICs). For the battery monitoring circuit 120, for example, BQ76940 may be used.

The voltage sensing channel 110 may include a plurality of voltage sensing lines $L_0 \sim L_{m+n+1}$. Each of the plurality of voltage sensing lines $L_0 \sim L_{m+n+1}$ may include a protection resistor R having a predetermined resistance. The protection resistor R is provided to prevent an overcurrent through the voltage sensing line in which the protection resistor R is included.

One end and the other end of the voltage sensing line $L_0$ are connected to the negative electrode of the battery cell $C_1$ and the voltage sensing pin $P_0$ of the battery monitoring circuit 120, respectively.

When i is a natural number of m or smaller, one end and the other end of the voltage sensing line $L_i$ are connected to the positive electrode of the battery cell $C_i$ and the voltage sensing pin $P_i$ of the battery monitoring circuit 120, respectively.

One end and the other end of the voltage sensing line $L_{m+1}$ are connected to the negative electrode of the battery cell $C_{m+1}$ and the voltage sensing pin $P_{m+1}$ of the battery monitoring circuit 120, respectively.

When j is a natural number of m+2 or greater and m+n+1 or smaller, one end and the other end of the voltage sensing line $L_j$ are connected to the positive electrode of the battery cell $C_j$ and the voltage sensing pin $P_j$ of the battery monitoring circuit 120, respectively.

The battery monitoring circuit 120 detects a voltage across each of the plurality of battery cells $C_1$~$C_{m+n}$ using a potential difference of every two adjacent voltage sensing pins among the plurality of voltage sensing pins $P_0$~$P_{m+n+1}$.

That is, when i is a natural number of m or smaller and j is a natural number of m+2 or greater and m+n+1 or smaller, the potential difference between two voltage sensing pins $P_{i-1}$, $P_i$ is detected as the voltage of the battery cell $C_i$, and the potential difference between two voltage sensing pins $P_{j-1}$, $P_j$ is detected as the voltage of the battery cell $C_{j-1}$. In an example, the battery monitoring circuit 120 may detect the potential difference between two adjacent voltage sensing pins $P_{m-1}$, $P_m$ as the voltage of the battery cell $C_m$. In another example, the battery monitoring circuit 120 may detect the potential difference between two adjacent voltage sensing pins $P_{m+1}$, $P_{m+2}$ as the voltage of the battery cell $C_{m+1}$.

The control circuit 140 may collect a voltage signal from the battery monitoring circuit 120 at a set time interval (for example, 0.001 sec), and determine a value indicating the voltage of each of the plurality of battery cells $C_1$~$C_{m+n}$ through analog-digital conversion.

The bypass device 130 is connected to the busbar 13 in parallel through the pair of voltage sensing lines $L_m$, $L_{m+1}$. Specifically, one end and the other end of the bypass device 130 are connected to the pair of voltage sensing pins $P_m$, $P_{m+1}$, respectively. Accordingly, a closed loop including the bypass device 130, the voltage sensing pin $P_{m+1}$, the voltage sensing line $L_{m+1}$, the busbar 13, the voltage sensing line $L_m$ and the voltage sensing pin $P_m$ is formed. While a predetermined condition (for example, a discharge mode of the battery pack) for the bypass device 130 is satisfied, the two voltage sensing pins $P_m$, $P_{m+1}$ are electrically connected through the bypass device 130. In contrast, while the predetermined condition for the bypass device 130 is unsatisfied, the current path between the two voltage sensing pins $P_m$, $P_{m+1}$ through the bypass device 130 is blocked.

Although FIG. 1 shows the bypass device 130 positioned outside of the battery monitoring circuit 120, alternatively, the bypass device 130 may be integrated in the battery monitoring circuit 120 as a component of the battery monitoring circuit 120.

When the busbar 13 is in normal condition, the resistance of the busbar 13 is much smaller than the resistance of the protection resistor R included in the two voltage sensing lines $L_m$, $L_{m+1}$, and thus all or most of electric currents flowing through the battery pack 10 passes through the busbar 13 and only an electric current of 0 A or a negligibly small amount in the bypass device 130.

In contrast, when the busbar 13 is in a fault condition, (i) the resistance of the busbar 13 itself, (ii) the contact resistance between one end of the busbar 13 and the plus terminal of the first battery module 11 and/or (iii) the contact resistance between the other end of the busbar 13 and the minus terminal of the second battery module 12 increases from the normal level. Accordingly, as the fault condition of the busbar 13 gets severe, there is a gradual increase in the amount of electric current passing through the bypass device 130 among the total amount of electric current flowing through the battery pack 10.

The control circuit 140 is operably coupled to the relay 20, the battery monitoring circuit 120, the shunt resistor 150 and/or the communication circuit 160.

The control circuit 140 may be implemented in hardware using at least one of digital signal processors (DSPs), digital signal processing devices (DSPDs), programmable logic devices (PLDs), field programmable gate arrays (FPGAs), microprocessors or electrical units for performing the other functions.

The control circuit 140 may have a memory embedded therein. The memory may pre-store programs and data necessary to perform battery management methods according to embodiments as described below. The memory may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM).

The shunt resistor 150 is electrically connected in series to the series circuit of the first battery module 11, the busbar 13 and the second battery module 12 through the power line. The battery monitoring circuit 120 is connected to one end and the other end of the shunt resistor 150 through a pair of current sensing pins, respectively. The battery monitoring circuit 120 is configured to detect the electric current flowing through the battery pack 10 based on a potential difference between the pair of current sensing pins, and output a current signal indicating the detected electric current to the control circuit 140.

The communication circuit 160 may be coupled to the high-level controller 2 of the energy storage system 1 to enable communication between them. The communication circuit 160 may transmit a message from the high-level controller 2 to the control circuit 140 and a message from the control circuit 140 to the high-level controller 2. The message from the control circuit 140 may include information for notifying a fault in the busbar 13 and/or voltage of the battery cell C. For the communication between the communication circuit 160 and the high-level controller 2, for example, a wired network such as local area network (LAN), controller area network (CAN) and daisy chain and/or a near field wireless network such as Bluetooth, Zigbee and WiFi may be used. The communication circuit 160 may include an output device (for example, a display, a speaker) to provide the information received from the control circuit 140 and/or the high-level controller 2 in a recognizable format. The high-level controller 2 may control the power conversion system 30 based on the information collected through the communication with the busbar diagnosis apparatus 100.

Figure 2:
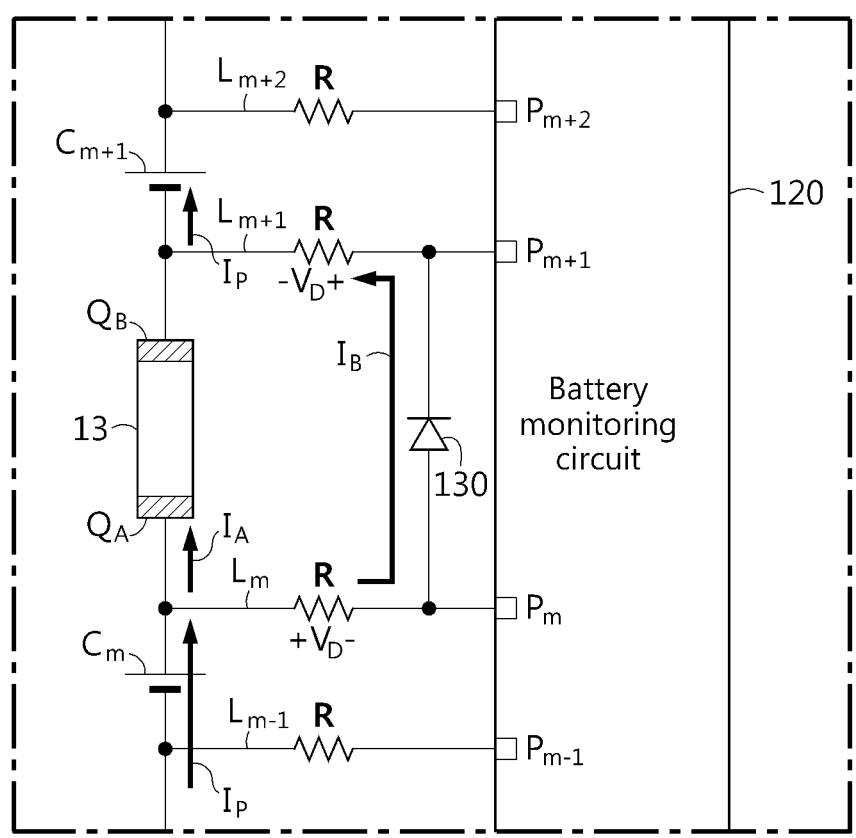
FIG. 2 is a diagram for reference in describing a relationship between a fault condition of a busbar shown in FIG. 1 and a voltage detection error of a battery cell.

FIG. 2 is a diagram for reference in describing a relationship between a fault condition of the busbar shown in FIG. 1 and a voltage detection error of the battery cell.

In FIG. 2, a diode used for the bypass device 130 is shown by way of illustration. The anode and the cathode of the diode may be connected to the voltage sensing pin $P_m$ and the voltage sensing pin $P_{m+1}$, respectively. In this case, a voltage across the busbar 13 is applied to the diode as a forward voltage during the discharge of the battery pack 10, and the diode turns on (conducts the electric current). That is, the diode allows the electric current to flow while the battery pack 10 is in the discharge mode, and while the diode conducts the electric current, the current path parallel to the busbar 13 is formed. The discharge mode refers to a mode in which power is supplied from the battery pack 10 to the power conversion system by the flow of the discharge current through the first battery module 11 and the second battery module 12.

Referring to FIG. 2, when the busbar 13 is in a fault condition by some reasons, the total resistance of the busbar 13 increases above the allowed value from the initial value as described above. The total resistance of the busbar 13 is the sum of (i) the resistance of the busbar 13 itself, (ii) the contact resistance at the connection portion $Q_A$ between one end of the busbar 13 and the plus terminal of the first battery module 11 and (iii) the contact resistance at the connection portion $Q_B$ between the other end of the busbar 13 and the minus terminal of the second battery module 12.

In this case, the electric current $I_P$ of the battery pack 10 is equal to the sum of the electric current $I_A$ flowing through the busbar 13 and the electric current $I_B$ flowing through the bypass device 130. When the bypass device 130 turns on (conducts the electric current), as the total resistance of the busbar 13 is larger, a ratio $I_B/I_A$ of the electric current $I_B$ flowing through the bypass device 130 to the electric current $I_A$ flowing through the busbar 13 is larger according to a resistance ratio between the busbar 13 and the bypass path. The bypass path is a series connection path of the voltage sensing line $L_m$, the bypass device 130 and the voltage sensing line $L_{m+1}$. That is, the flow of the electric current $I_B$ through the bypass device 130 refers to the flow of the electric current $I_B$ through the pair of voltage sensing lines $L_m$, $L_{m+1}$.

When the electric current $I_B$ flows through the voltage sensing line $L_m$, a voltage drop VD corresponding to multiplication of the electric current $I_B$ by the resistance of the protection resistor R occurs between the positive electrode of the battery cell $C_m$ and the voltage sensing pin $P_m$. Additionally, when the electric current $I_B$ flows through the voltage sensing line $L_{m+1}$, a voltage drop VD corresponding to multiplication of the electric current $I_B$ by the resistance of the protection resistor R occurs between the voltage sensing pin $P_{m+1}$ and the negative electrode of the battery cell $C_{m+1}$.

Accordingly, the voltage of the battery cell $C_m$ detected by the battery monitoring circuit 120 reduces by as much as the voltage drop $V_D$ at the voltage sensing line $L_m$ from the actual voltage of the battery cell $C_m$. Additionally, the voltage of the battery cell $C_{m+1}$ detected by the battery monitoring circuit 120 also reduces by as much as the voltage drop $V_D$ at the voltage sensing line $L_{m+1}$ from the actual voltage of the battery cell $C_{m+1}$. That is, an error occurs in the detection result of the voltage of the battery cell $C_m$ disposed on the most upstream of the first battery module 11 and the voltage of the battery cell $C_{m+1}$ disposed on the most downstream of the second battery module 12.

Figure 3:
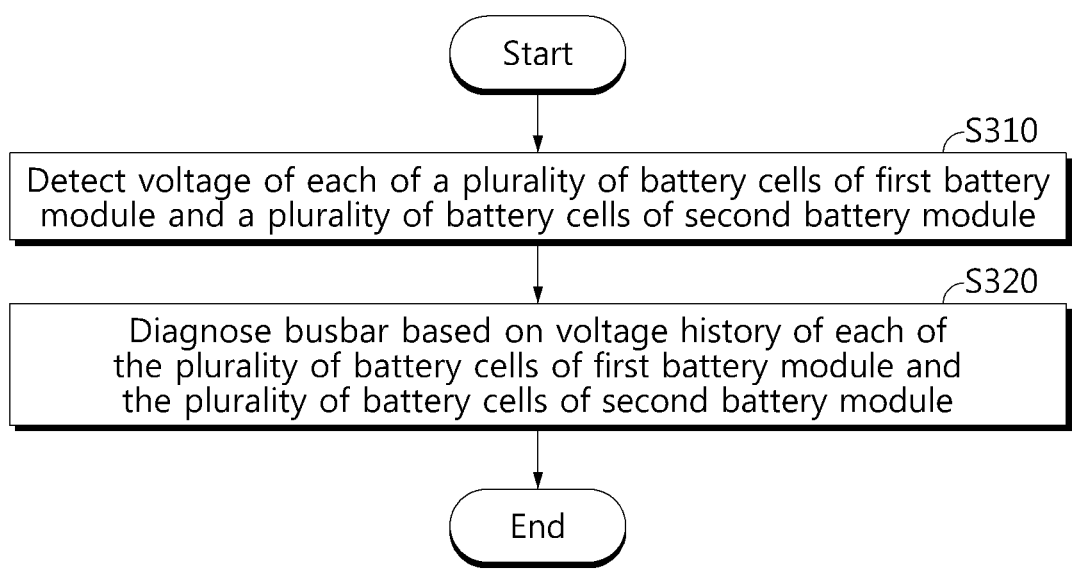
FIG. 3 is an exemplary flowchart of a busbar diagnosis method according to the present disclosure.
Figure 4:
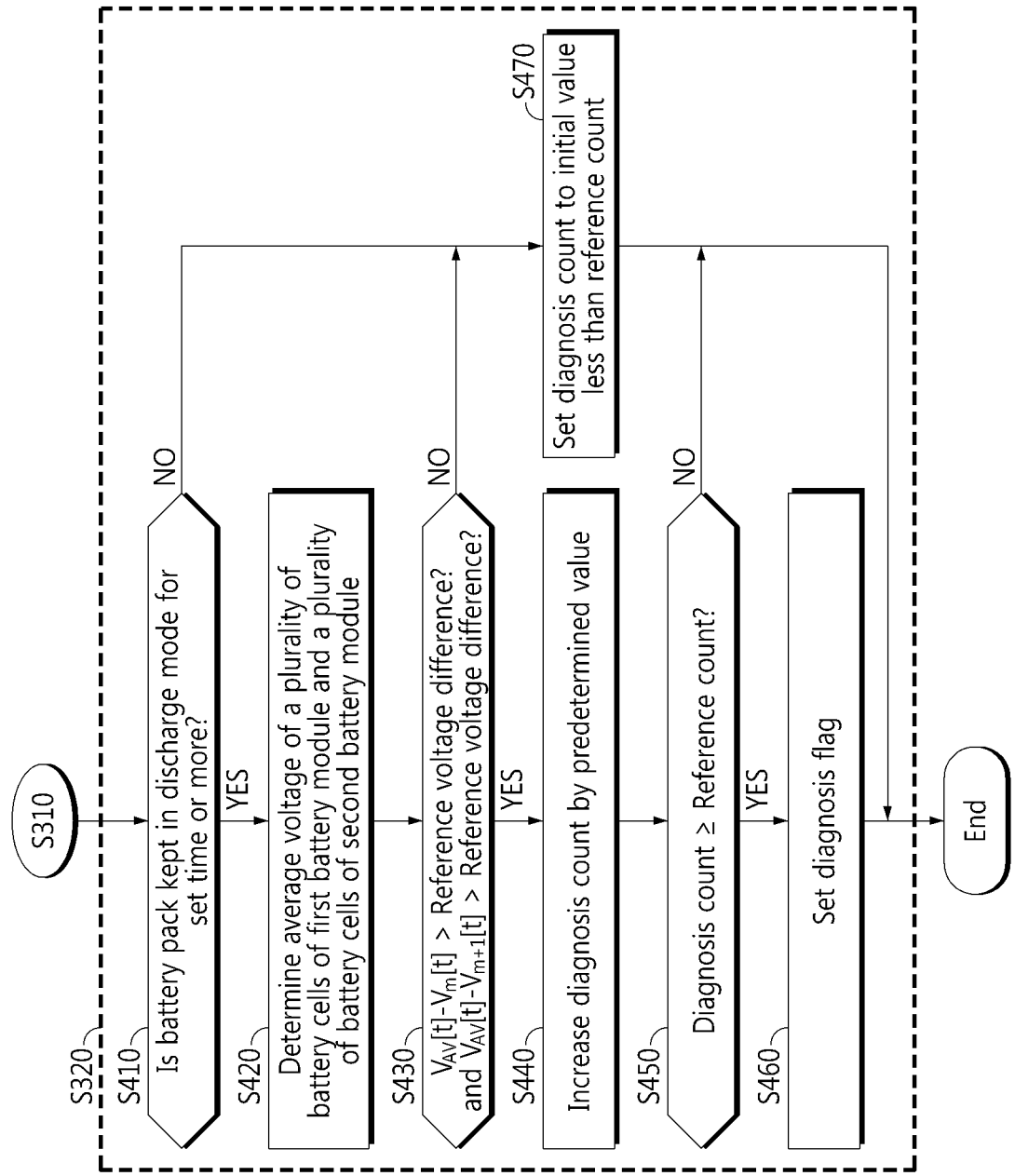
FIG. 4 is a schematic flowchart showing a fault detection process according to a first embodiment for performing the step S320 of FIG. 3.
Figure 5:
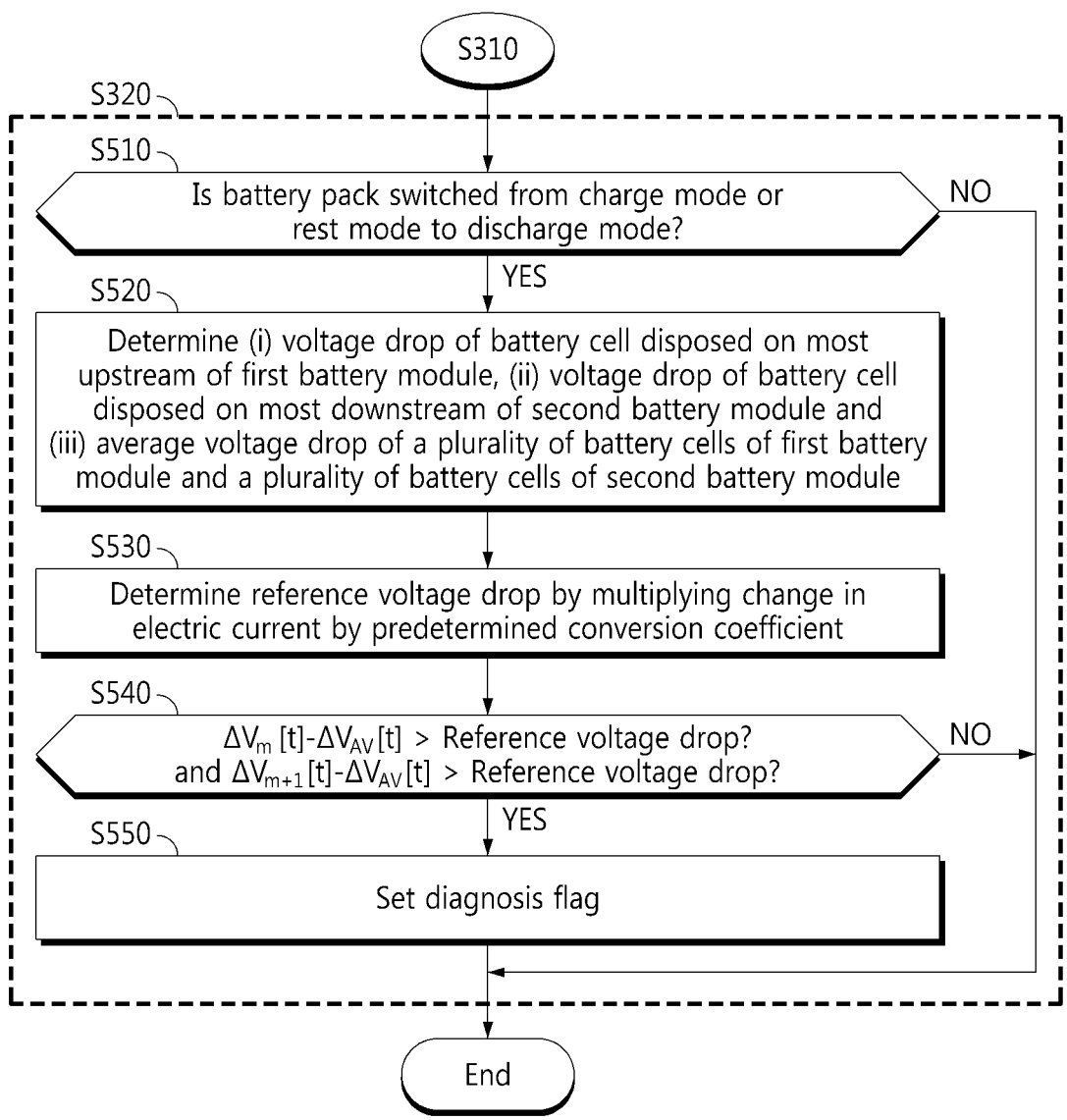
FIG. 5 is a schematic flowchart showing a fault detection process according to a second embodiment for performing the step S320 of FIG. 3.

FIG. 3 is an exemplary flowchart of a busbar diagnosis method according to the present disclosure, FIG. 4 is a schematic flowchart of a fault detection process according to a first embodiment for performing the step S320 of FIG. 3, and FIG. 5 is a schematic flowchart of a fault detection process according to a second embodiment for performing the step S320 of FIG. 3. The method of FIGS. 3 to 5 may be repeatedly performed by the busbar diagnosis apparatus 100 in a periodic manner at each predetermined diagnosis time. The diagnosis time may be equal to the above-described predetermined time or may be preset to the integer multiple of the predetermined time.

Referring to FIGS. 1 to 3, in step S310, the battery monitoring circuit 120 detects the voltage of each of the plurality of battery cells $C_1$~$C_m$ of the first battery module 11 and the plurality of battery cells $C_{m+1}$~$C_{m+n}$ of the second battery module 12 using the potential difference of every two adjacent voltage sensing pins (for example, $P_0$, $P_i$) among the plurality of voltage sensing pins $P_0$~$P_{m+n+1}$. The control circuit 140 may collect an analog signal indicating the voltage of each of the plurality of battery cells $C_1$~$C_{m+n}$ detected by the battery monitoring circuit 120, convert the collected analog signal to a digital signal, and record it in the memory as the latest value in time series indicating a voltage history. The time series indicating the voltage history of the battery cell C includes a value of the voltage detected in the previous cycle and a value of the voltage detected in the present cycle. In the step S310, the battery monitoring circuit 120 may further detect the electric current of the battery pack 10 using the pair of current sensing pins. That is, the control circuit 140 may collect an analog signal indicating the electric current of the battery pack 10, convert the collected analog signal to a digital signal, and record it in the memory as the latest value in time series indicating a current history.

In step S320, the control circuit 140 diagnoses the busbar 13 based on the voltage history of each of the plurality of battery cells $C_1$~$C_m$ of the first battery module 11 and the plurality of battery cells $C_{m+1}$~$C_{m+n}$ of the second battery module 12, detected by the battery monitoring circuit 120.

Referring to FIG. 4, the step S320 according to the first embodiment includes steps S410~S470. In the step S410, the control circuit 140 determines if the battery pack 10 is kept in the discharge mode for a set time (for example, 1 sec) or more based on the electric current detected by the battery monitoring circuit 120. That is, the control circuit 140 records a time series indicating a history of changes of the electric current of the battery pack 10 in the memory, and determines if the battery pack 10 is being continuously discharged for the set time or more based on the recorded time series of the electric current. For example, in case that it is programmed to record the charge current of the battery pack 10 as a positive value and the discharge current as a negative value in the memory, when the time series of the electric current recorded in the time range from a set time earlier than the present time to the present time is recorded as a negative value, the control circuit 140 determines that a value of the step S410 is "YES", and otherwise, determines that the value of the step S410 is "NO". When the value of the step S410 is "YES", step S420 is performed. When the value of the step S410 is "NO", the step S470 is performed.

In the step S420, the control circuit 140 determines an average voltage of the plurality of battery cells $C_1$~$C_m$ of the first battery module 11 and the plurality of battery cells $C_{m+1}$~$C_{m+n}$ of the second battery module 12. The average voltage in the step S420 may be determined by the following Equation 1 or 2.

$$V_{AV}[t] = \frac{\sum_{y=1}^{m+n} v_y[t]}{m+n} \quad \langle \text{Equation 1} \rangle$$

$$V_{AV}[t] = \frac{\sum_{y=1}^{m-1} v_y[t] + \sum_{y=m+2}^{m+n} v_y[t]}{m+n-2} \quad \langle \text{Equation 2} \rangle$$

In Equations 1 and 2, t is the present time, $V_y[t]$ is the voltage of the battery cell $C_y$ at the present time, detected by the battery monitoring device, and $V_{AV}[t]$ is the average voltage at the present time. Equation 2 is different from Equation 1 since the average voltage is calculated with the exclusion of the voltages $V_m[t]$, $V_{m+1}[t]$ of the two battery cells $C_m$, $C_{m+1}$ relying on the condition of the busbar 13.

In the step S430, the control circuit 140 determines if both (i) a difference $V_{AV}[t]-V_m[t]$ between the voltage $V_m[t]$ of the battery cell $C_m$ disposed on the most upstream of the first battery module 11 and the average voltage $V_{AV}[t]$ and (ii) a difference $V_{AV}[t]-V_{m+1}[t]$ between the voltage $V_{m+1}[t]$ of the battery cell $C_{m+1}$ disposed on the most downstream of the second battery module 12 and the average voltage $V_{AV}[t]$ are larger than a reference voltage difference. When the busbar 13 and the plurality of battery cells $C_1 \sim C_{m+n}$ are all in normal condition, the reference voltage difference (for example, 0.3 V) is preset to be larger than $V_{AV}[t]-V_m[t]$ and $V_{AV}[t]-V_{m+1}[t]$, taking into account the ability of the battery monitoring circuit 120 to divide the voltage. A value of the step S430 being "YES" indicates that the likelihood that the busbar 13 is in a fault condition is equal to or larger than the reference value. When the value of the step S430 is "YES", the step S440 is performed. When the value of the step S430 is "NO", the step S470 is performed.

In the step S440, the control circuit 140 increases a diagnosis count by a predetermined value (for example, 1). The diagnosis count indicates the number of times the value of the step S430 is continuously determined as "YES".

In the step S450, the control circuit 140 determines if the diagnosis count is equal to or larger than a reference count (for example, 3). When a value of the step S450 is "YES", the step S460 is performed.

In the step S460, the control circuit 140 sets a diagnosis flag indicating that the busbar 13 is in a fault condition. The control circuit 140 may perform a predetermined protection operation in response to the diagnosis flag being set. In an example, the control circuit 140 may transmit a fault message indicating that the busbar 13 is in a fault condition to the high-level controller 2. The high-level controller 2 may stop the power conversion system 30 in response to the fault message. In another example, the control circuit 140 may turn off the relay 20. In another example, the control circuit 140 may set each of the detected voltage values $V_m[t]$, $V_{m+1}[t]$ of the battery cells $C_m$, $C_{m+1}$ to be equal to the average voltage $V_{AV}[t]$ of the plurality of battery cells $C_1 \sim C_{m+n}$.

In the step S470, the control circuit 140 sets the diagnosis count to the initial value (for example, 0) less than the reference count.

Referring to FIG. 5, the step S320 according to the second embodiment includes steps S510~S550. In the step S510, the control circuit 140 determines if the battery pack 10 is switched from a charge mode or a rest mode to the discharge mode based on the electric current detected by the battery monitoring circuit 120. The rest mode refers to a mode in which the relay 20 is off or the power conversion system 30 stops and thus both the charge current and the discharge current do not flow through the first battery module 11 and the second battery module 12. The charge mode refers to a mode in which power is supplied from the power conversion system to the battery pack 10 and the charge current flows through the first battery module 11 and the second battery module 12.

For example, the control circuit 140 records a time series indicating a history of changes of the electric current of the battery pack 10 in the memory, and when the electric current at the diagnosis time earlier than the present time is recorded as 0 or a positive value based on the recorded time series of the electric current, and the electric current at the present time is recorded as a negative value, the control circuit 140 may determine a value of the step S510 as "YES". If not so, the value of the step S510 may be determined as "NO". When the value of the step S510 is "YES", the step S520 is performed.

In the step S520, the control circuit 140 determines a voltage drop of the battery $C_m$ disposed on the most upstream of the first battery module 11, a voltage drop of the battery $C_{m+1}$ cell disposed on the most downstream of the second battery module 12 and an average voltage drop of the plurality of battery cells $C_1 \sim C_m$ of the first battery module 11 and the plurality of battery cells $C_{m+1} \sim C_{m+n}$ of the second battery module 12 over the diagnosis time. The average voltage drop in the step S520 may be determined by the following Equation 3 or 4.

$$\Delta V_{AV}[t] = \frac{\sum_{y=1}^{m+n}\Delta v_y[t]}{m+n} \quad \langle\text{Equation 3}\rangle$$

$$\Delta V_{AV}[t] = \frac{\sum_{y=1}^{m-1}\Delta v_y[t] + \sum_{y=m+2}^{m+n}\Delta v_y[t]}{m+n-2} \quad \langle\text{Equation 4}\rangle$$

In Equations 3 and 4, t is the present time, $\Delta V_y[t]$ is the voltage drop of the battery cell $C_y$, and $\Delta V_{AV}[t]$ is the average voltage drop. $\Delta V_y[t]$ is equal to $V_y[t-t_D]-V_y[t]$, and $t_D$ is the diagnosis time. That is, $V_y[t-t_D]$ may be the voltage of the battery cell $C_y$ detected during the operation of the battery pack 10 in the rest mode or the charge mode, and $V_y[t]$ may be the voltage of the battery cell $C_y$ detected for the first time after the switch of the battery pack 10 from the rest mode or the charge mode to the discharge mode.

Equation 4 is different from Equation 3 since the average voltage drop is calculated with the exclusion of the voltage drop $\Delta V_m[t]$, $\Delta V_{m+1}[t]$ of the two battery cells $C_m$, $C_{m+1}$ relying on the condition of the busbar 13.

In the step S530, the control circuit 140 determines a reference voltage drop by multiplying a change in electric current over the diagnosis time by a predetermined conversion coefficient. The change in electric current may be equal to $I_P[t-t_D]-I_P[t]$. $I_P[t-t_D]$ may be the electric current of the battery pack 10 detected during the operation of the battery pack 10 in the rest mode or the charge mode, and $I_P[t]$ may be the electric current of the battery pack 10 detected for the first time after the switch of the battery pack 10 from the rest mode or the charge mode to the discharge mode. The conversion coefficient may be a preset value, taking into account the internal resistance range when the battery cell C is in normal condition.

In the step S540, the control circuit 140 determines if both (i) a difference $\Delta V_m[t]-\Delta V_{AV}[t]$ between the voltage drop $\Delta V_m[t]$ of the battery cell $C_m$ disposed on the most upstream of the first battery module 11 and the average voltage drop $\Delta V_{AV}[t]$ and (ii) a difference $\Delta V_{m+1}[t]-\Delta V_{AV}[t]$ between the voltage drop $\Delta V_{m+1}[t]$ of the battery cell $C_{m+1}$ disposed on the most downstream of the second battery module 12 and the average voltage drop $\Delta V_{AV}[t]$ are larger than the reference voltage drop. The value of the step S540 being "YES" indicates that the busbar 13 is in a fault condition. When the value of the step S540 is "YES", the step S550 is performed.

In the step S550, the control circuit 140 sets a diagnosis flag indicating that the busbar 13 is in a fault condition. The control circuit 140 may perform a predetermined protection operation in response to the diagnosis flag being set. In an example, the control circuit 140 may transmit a fault message indicating that the busbar 13 is in a fault condition to the high-level controller 2. The high-level controller 2 may stop the power conversion system 30 in response to the fault message. In another example, the control circuit 140 may turn off the relay 20.

The embodiments of the present disclosure described hereinabove are not implemented only through the apparatus and method, and may be implemented through programs that perform the functions corresponding to the configurations of the embodiments of the present disclosure or recording media having the programs recorded thereon, and such implementation may be easily achieved by those skilled in the art from the disclosure of the embodiments described above.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and all or some of the embodiments may be selectively combined to allow various modifications.

(Description of Reference Numerals)

| | |
|---|---|
| 1: Energy storage system | |
| 10: Battery pack | 11, 12: Battery module  C: Battery cell |
| 20: Relay | |
| 30: Power conversion system | |
| 100: Busbar diagnosis apparatus | |
| 110: Voltage sensing channel | L: Voltage sensing line |
| 120: Battery monitoring circuit | P: voltage sensing pin |
| 130: Bypass device | |
| 140: Control circuit | |
| 150: Communication circuit | |

What is claimed is:

1. A busbar diagnosis apparatus for a battery pack including a busbar connected between a positive terminal of a first battery module including a plurality of battery cells connected in series and a negative terminal of a second battery module including a plurality of battery cells connected in series, the busbar diagnosis apparatus comprising:
    a battery monitoring circuit including a plurality of voltage sensing pins, and the battery monitoring circuit is configured to detect a voltage of each of the plurality of battery cells of the first battery module and the plurality of battery cells of the second battery module using a potential difference of every two adjacent voltage sensing pins;
    a voltage sensing channel including a plurality of voltage sensing lines connecting a positive electrode and a negative electrode of each of the plurality of battery cells of the first battery module and the plurality of battery cells of the second battery module to the plurality of voltage sensing pins;
    a bypass unit connected to the busbar through a first voltage sensing pin and a second voltage sensing pin among the plurality of voltage sensing pins, wherein the first voltage sensing pin is connected to the positive electrode of the battery cell disposed on a most upstream of the first battery module through one of the plurality of voltage sensing lines and the second voltage sensing pin is connected to the negative electrode of the battery cell disposed on a most downstream of the second battery module through the other voltage sensing line among the plurality of voltage sensing lines; and
    a control circuit configured to:
    when it is determined that the battery pack is kept in a discharge mode for a set time or more,
    determine an average voltage of the plurality of battery cells of the first battery module and the plurality of battery cells of the second battery module;
    increase a diagnosis count by a predetermined value when both a difference between the voltage of the battery cell disposed on the most upstream of the first battery module and the average voltage and a difference between the voltage of the battery cell disposed on the most downstream of the second battery module and the average voltage are larger than a reference voltage difference, and
    set a diagnosis flag indicating that the busbar is in a fault condition when the increased diagnosis count is equal to or larger than a reference count.

2. The busbar diagnosis apparatus according to claim 1, wherein the bypass unit includes a diode, and
    wherein an anode and a cathode of the diode are connected to the first voltage sensing pin and the second voltage sensing pin, respectively.

3. The busbar diagnosis apparatus according to claim 1, wherein each voltage sensing line includes a protection resistor having a predetermined resistance value.

4. The busbar diagnosis apparatus according to claim 1, wherein the battery monitoring circuit further includes a pair of current sensing pins connected to a current path of the battery pack, and the battery monitoring circuit is further configured to detect an electric current flowing through the current path using a potential difference between the pair of current sensing pins.

5. The busbar diagnosis apparatus according to claim 1, wherein the control circuit is further configured to set the diagnosis count to be equal to an initial value less than the reference count when at least one of the difference between the voltage of the battery cell disposed on the most upstream of the first battery module and the average voltage or the difference between the voltage of the battery cell disposed on the most downstream of the second battery module and the average voltage is equal to or smaller than the reference voltage difference.

6. A battery pack comprising the busbar diagnosis apparatus according to claim 1.

7. An energy storage system comprising the battery pack according to claim 6.

8. A busbar diagnosis method executable by the busbar diagnosis apparatus according to claim 1, the busbar diagnosis method comprising:
    detecting, by the battery monitoring circuit, the voltage of each of the plurality of battery cells of the first battery module and the plurality of battery cells of the second battery module using the potential difference between every two adjacent voltage sensing pins among the plurality of voltage sensing pins;
    determining the average voltage of the plurality of battery cells of the first battery module and the plurality of battery cells of the second battery module when it is determined that the battery pack is kept in the discharge mode for the set time or more;
    increasing the diagnosis count by the predetermined value when both the difference between the voltage of the battery cell disposed on the most upstream of the first battery module and the average voltage and the difference between the voltage of the battery cell disposed on the most downstream of the second battery module and the average voltage are larger than the reference voltage difference; and setting the diagnosis flag indicating that the busbar is in the fault condition when the increased diagnosis count is equal to or larger than the reference count.

9. A busbar diagnosis apparatus for a battery pack including a busbar connected between a positive terminal of a first battery module including a plurality of battery cells connected in series and a negative terminal of a second battery module including a plurality of battery cells connected in series, the busbar diagnosis apparatus comprising:

a battery monitoring circuit including a plurality of voltage sensing pins, and the battery monitoring circuit is configured to detect a voltage of each of the plurality of battery cells of the first battery module and the plurality of battery cells of the second battery module using a potential difference of every two adjacent voltage sensing pins;

a voltage sensing channel including a plurality of voltage sensing lines connecting a positive electrode and a negative electrode of each of the plurality of battery cells of the first battery module and the plurality of battery cells of the second battery module to the plurality of voltage sensing pins;

a bypass unit connected to the busbar through a first voltage sensing pin and a second voltage sensing pin among the plurality of voltage sensing pins, wherein the first voltage sensing pin is connected to the positive electrode of the battery cell disposed on a most upstream of the first battery module through one of the plurality of voltage sensing lines and the second voltage sensing pin is connected to the negative electrode of the battery cell disposed on a most downstream of the second battery module through the other voltage sensing line among the plurality of voltage sensing lines; and a control circuit configured to:

when it is determined that the battery pack is switched from a rest mode or a charge mode to a discharge mode, determine a voltage drop of the battery cell disposed on the most upstream of the first battery module, a voltage drop of the battery cell disposed on the most downstream of the second battery module and an average voltage drop of the plurality of battery cells of the first battery module and the plurality of battery cells of the second battery module, over a diagnosis time, and set a diagnosis flag indicating that the busbar is in a fault condition when both a difference between the voltage drop of the battery cell disposed on the most upstream of the first battery module and the average voltage drop and a difference between the voltage drop of the battery cell disposed on the most downstream of the second battery module and the average voltage drop are larger than a reference voltage drop.

10. The busbar diagnosis apparatus according to claim 9, wherein the control circuit is further configured to determine the reference voltage drop by multiplying a change in electric current over the diagnosis time by a predetermined conversion coefficient when it is determined that the battery pack is switched from the rest mode or the charge mode to the discharge mode.

11. A busbar diagnosis method executable by the busbar diagnosis apparatus according to claim 9, the busbar diagnosis method comprising:

detecting, by the battery monitoring circuit, the voltage of each of the plurality of battery cells of the first battery module and the plurality of battery cells of the second battery module using the potential difference between every two adjacent voltage sensing pins among the plurality of voltage sensing pins;

when it is determined that the battery pack is switched from the rest mode or the charge mode to the discharge mode, determining the voltage drop of the battery cell disposed on the most upstream of the first battery module, the voltage drop of the battery cell disposed on the most downstream of the second battery module and an average voltage drop of the plurality of battery cells of the first battery module and the plurality of battery cells of the second battery module, over the diagnosis time; and setting the diagnosis flag indicating that the busbar is in the fault condition when both the difference between the voltage drop of the battery cell disposed on the most upstream of the first battery module and the average voltage drop and the difference between the voltage drop of the battery cell disposed on the most downstream of the second battery module and the average voltage drop are larger than the reference voltage drop.

12. A battery pack comprising the busbar diagnosis apparatus according to claim 9.

13. An energy storage system comprising the battery pack according to claim 12.

* * * * *